(12) United States Patent
Mullen et al.

(10) Patent No.: US 6,621,373 B1
(45) Date of Patent: Sep. 16, 2003

(54) APPARATUS AND METHOD FOR UTILIZING A LOSSY DIELECTRIC SUBSTRATE IN A HIGH SPEED DIGITAL SYSTEM

(75) Inventors: Donald R. Mullen, Mountain View, CA (US); Donald V. Perino, Los Altos, CA (US); Haw-Jyh Liaw, Fremont, CA (US)

(73) Assignee: Rambus Inc., Los Altos, CA (US)

( * ) Notice: Subject to any disclaimer, the term of this patent is extended or adjusted under 35 U.S.C. 154(b) by 0 days.

(21) Appl. No.: 09/579,776

(22) Filed: May 26, 2000

(51) Int. Cl.[7] ................................. H01P 1/23
(52) U.S. Cl. ........................ 333/81 A; 333/12
(58) Field of Search ........................ 333/12, 202, 81 R, 333/81 A

(56) References Cited

U.S. PATENT DOCUMENTS

| | | | | |
|---|---|---|---|---|
| 4,301,040 A | * | 11/1981 | Berbeco | 252/511 |
| 4,510,468 A | * | 4/1985 | Mayer | 333/12 |
| 4,683,450 A | * | 7/1987 | Max et al. | 333/202 |
| 4,866,507 A | * | 9/1989 | Jacobs et al. | 357/74 |
| 5,087,900 A | | 2/1992 | Birchak et al. | 333/100 |
| 5,225,796 A | * | 7/1993 | Williams et al. | 333/12 |
| 5,367,956 A | * | 11/1994 | Fogle, Jr. | 333/81 R |
| 6,215,372 B1 | * | 4/2001 | Novak | 333/12 |

FOREIGN PATENT DOCUMENTS

WO    WO 99/17404 A1  *  4/1999

* cited by examiner

*Primary Examiner*—Benny Lee
*Assistant Examiner*—Stephen E. Jones
(74) *Attorney, Agent, or Firm*—Pennie & Edmonds LLP

(57) ABSTRACT

An electronic device includes a standard dielectric material and a lossy material integrated with the standard dielectric material to selectively control the distributed resistance of the standard dielectric material. The lossy material may be inserted into the standard dielectric material. The inserted material may be resistive particles, carbon particles, open cell conductive foam, carbon impregnated open cell conductive foam, and the like. The lossy material may also be a loss inducing physical structure attached to the standard dielectric material. The loss inducing physical structure may be a planar resistive layer attached to the standard dielectric material. The planar resistive layer may have an extended surface to attenuate high frequency signals.

12 Claims, 7 Drawing Sheets

APPARATUS AND METHOD FOR UTILIZING A LOSSY DIELECTRIC SUBSTRATE IN A HIGH SPEED DIGITAL SYSTEM

BRIEF DESCRIPTION OF THE INVENTION

This invention relates generally to electronic systems. More particularly, this invention relates to a technique for utilizing a lossy dielectric substrate in a high speed electronic system.

BACKGROUND OF THE INVENTION

A dielectric or electrical insulator is a material with substantially limited electrical conductivity. In particular, typical electrically insulating materials have a volume resistivity of $10^{12}$ ohm*m. A large number of commercial electrical insulators fall into, but are not limited to, two broad classes: ceramics and polymers (including thermoplastics and thermoset plastics). Widely used dielectric materials include vacuum, paper impregnated with oil or wax, polyester, polystyrene, polyimide, epoxy, fluorocarbon plastic, mica, glass, alumina ceramic, and glass ceramic.

Dielectric behavior in materials is often defined in terms of a parallel-plate electrical capacitor. When an electric field is established between the capacitor plates or electrodes, an electric charge forms on the plates. The electric field produces a charge density on the plates proportional to the field. For an evacuated gap between the plates, the constant of proportionality is called the permittivity of free space ($\in_0$) If the vacuum between the plates is replaced by a dielectric material, the charge density will increase for the same value of applied electric field; the permittivity ($\in$) of the dielectric material is greater than that of free space. The charge density increase comes from the polarization of the dielectric in the presence of the applied electric field. One can form a ratio of $\in$ and $\in_0$ to get a dimensionless number called the dielectric constant (K). The dielectric constant K equals 1 for vacuum.

Low values for K are desired for high speed electronics systems. Typical K values for dielectric substrates, based on glass-polymer resin systems, range from 2.5 to 5.0. Commercial materials include glass-reinforced epoxy and polyimide thermoset plastics and fluorocarbon plastic-based laminates. In general, the closer K is to unity, the more costly the substrate material.

Another important property of dielectrics for electronic use is dielectric loss. Dielectric loss is the measure of transformation of electrical energy into heat and is generally considered not desirable. The electric field-induced polarization occurring in the dielectric material is reversible in a time-varying electric field. However, the polarization reversal takes finite time and energy loss occurs as a function of the frequency of the electric field variation. For the capacitor with a lossy dielectric, the effect is that the plate charge density is out of phase with the applied variable electric field. Stated another way for the capacitor example, the current leads the voltage by exactly 90° for the perfect dielectric material. In an actual dielectric, the current leads the voltage by 90°−δ, where the angle δ is proportional to the dielectric energy loss. To keep δ (expressed as "loss factor" or K*tan δ in practice) small, system designers commonly use expensive dielectric materials. For example, E-glass (borosilicate electrical glass) is used in place of ordinary soda-lime glass for laminated circuit dielectric applications. Expensive fluorocarbon polymers are often used in microwave circuit applications.

FIG. 1 illustrates a prior art system including a signal generator 20, which generates a signal 22. The signal 22 transitions from a digital low value to a digital high value relatively quickly and therefore is referred to as having a relatively fast edge rate. The signal 22 is applied to a transmission system with a standard dielectric 24. The transmission system includes a conductor positioned on a standard dielectric. The transmission system 24 causes the edge rate of the original signal 22 to be delayed slightly, as shown with signal 26.

Expensive dielectric materials are used in prior art transmission systems of the type shown in FIG. 1 so that the edge rate of the originally generated signal is minimally altered. Although most prior art systems endeavor to minimize signal transition delay through the use of expensive dielectrics, there is a limited class of high speed electronic systems in which energy dissipation is desired. One way of dissipating energy in such systems is to add discrete energy dissipating components, such as resistive elements, e.g., discrete resistors. Unfortunately, this approach increases system cost.

In view of the foregoing, it would be highly desirable to identify digital systems in which it is not necessary to utilize expensive, low loss dielectric materials. It would also be desirable to identify a low cost lossy dielectric substrate for use in such systems.

SUMMARY OF THE INVENTION

The invention includes an electronic device. The electronic device has a standard dielectric material and a lossy material integrated with the standard dielectric material to selectively control the distributed resistance of the standard dielectric material. The lossy material may be integrated with the standard dielectric material through insertion. The inserted material may be resistive particles, carbon particles, open cell conductive foam, carbon impregnated open cell conductive foam, and the like. The lossy material may be integrated with the standard dielectric material by attaching a loss inducing physical structure to the standard dielectric material. The loss inducing physical structure may be a planar resistive layer attached to the standard dielectric material. The planar resistive layer may have an extended surface to attenuate high frequency signals.

The invention also includes a method of constructing an electronic device. The method includes the step of providing a standard dielectric material. The standard dielectric material is integrated with a lossy material so as to selectively control the distributed resistance of the standard dielectric material.

The invention achieves frequency response shaping through predetermined combinations of a standard dielectric material and a lossy material. The invention's incorporation of a lossy material with a standard dielectric material results in a low cost substrate that improves performance in selected high speed digital systems.

BRIEF DESCRIPTION OF THE DRAWINGS

For a better understanding of the invention, reference should be made to the following detailed description taken in conjunction with the accompanying drawings, in which.

Like reference numerals refer to corresponding parts throughout the drawings.

DETAILED DESCRIPTION OF THE INVENTION

Figure 1:
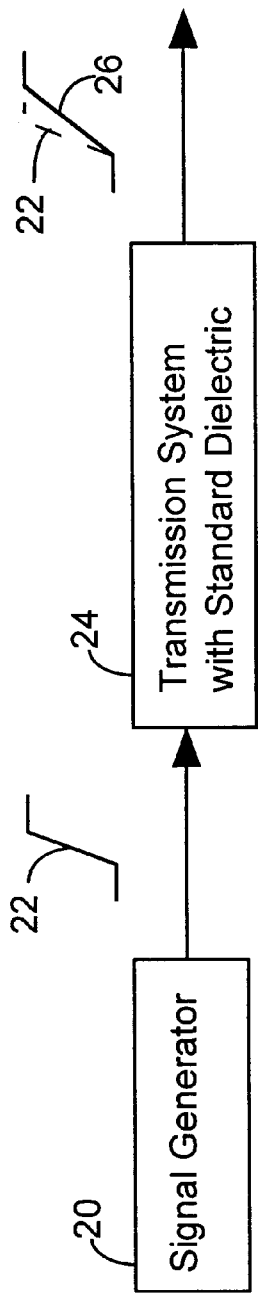
FIG. 1 illustrates a prior art system in which a signal generator applies a digital signal to a transmission system with a standard dielectric, resulting in a digital signal with a slightly reduced edge rate.
Figure 2:
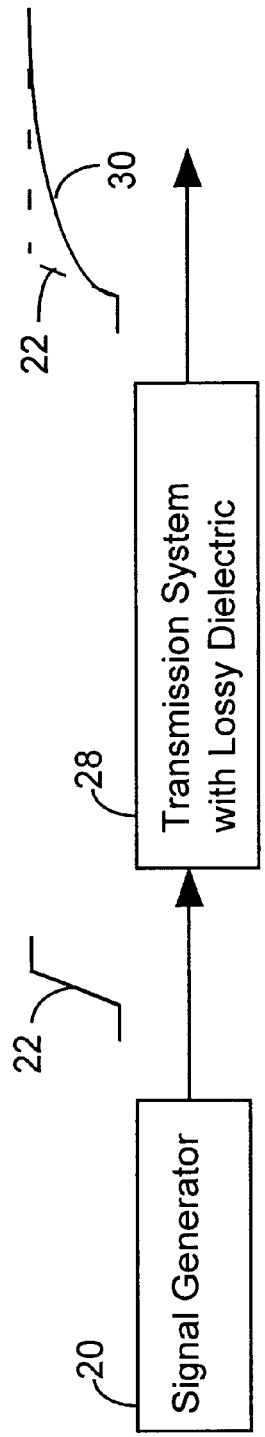
FIG. 2 illustrates a system in accordance with the invention in which a signal generator applies a digital signal to a transmission system with a lossy dielectric, resulting in a digital signal with an attenuated edge rate.

FIG. 2 illustrates a system constructed in accordance with the invention. The system includes a signal generator 20, which produces a digital signal 22 with a relatively fast edge rate, as in the case of the system of FIG. 1. However, in the case of the system of FIG. 2, the digital signal is applied to a transmission system with a lossy dielectric 28. The transmission system with a lossy dielectric 28 includes a transmission path (e.g., a copper lead) positioned on a lossy dielectric substrate constructed in accordance with the invention. The transmission system with a lossy dielectric produces a signal 30 with a substantially reduced edge transition rate. In particular, the system 28 attenuates the high frequency components of the original signal 22. The attenuated signal 30 is considered highly undesirable in most digital systems.

One aspect of the invention is to identify systems in which it is desirable to have reduced edge transition rates. A further aspect of the invention is to provide a low cost lossy substrate for use in such systems.

The invention is a lossy dielectric substrate for use in selected high speed digital systems. The term "lossy dielectric substrate" refers to a standard dielectric substrate that has been integrated with lossy materials to increase the dielectric losses associated with the standard dielectric substrate. As used herein, the term standard dielectric substrate refers to a substrate with a dielectric constant greater than or equal to one. By way of example, the dielectric constant may be approximately three or greater.

The integrated lossy material may be in the form of a loss inducing material inserted into a standard dielectric. Alternately, the integrated lossy material may be in the form of a loss inducing physical structure attached to the standard dielectric substrate. As discussed below, the loss inducing materials may include resistive particles, such as carbon, and open cell conductive foam. The loss inducing physical structure is typically a resistive planar structure attached to the standard dielectric substrate. The resistive planar structure may include an extended physical surface, such as a "waffle" pattern, which operates to dissipate high frequency signal components.

The combination of the standard dielectric with the integrated lossy material results in the lossy dielectric substrate of the invention. As used herein, the term lossy dielectric substrate refers to a standard dielectric with integrated lossy materials resulting in a composite structure with a new dielectric constant. In one example, the new dielectric constant is less than 5.

Figure 3:
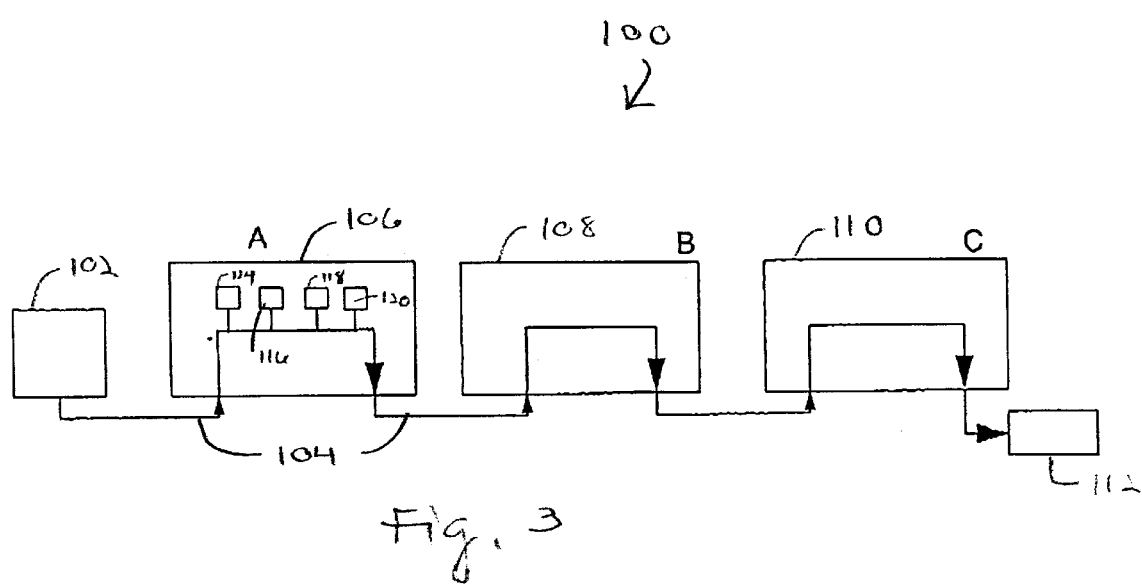
FIG. 3 illustrates a high speed digital system utilizing a lossy substrate of the invention.

The lossy dielectric substrate of the invention is advantageously used in high speed unloaded memory modules, such as the type shown in FIG. 3. FIG. 3 illustrates a memory system 100. The memory system 100 includes a memory controller 102, a high speed data bus 104, a loaded memory module 106, unloaded memory modules, 108, 110 and a termination resistor 112. In the memory system 100, the high speed data bus 104 connects memory modules 106–110 in series from the memory controller 102 to the termination resistor 112. The loaded memory module 106 includes memory devices 114–120 which perform memory functions. The unloaded memory modules 108 and 110 do not include a memory device. Unloaded memory modules 108, 110 are connected in the memory system 100 to maintain a continuous transmission line even though these modules 108, 110 do not include a memory device. Rambus Incorporated of Mountain View, Calif., the assignee of the present invention, licenses memory systems of the type shown in FIG. 3. The patent application entitled "High Frequency Bus System", Ser. No. 08/938,084, filed Sep. 26, 1997, which is incorporated by reference herein, describes a memory system of the type shown in FIG. 3.

Under certain circumstances, such as toggling a data pattern or impedance mismatch between modules, noise signals from unloaded modules 108, 110 may reduce the operating margin of memory devices 114–120 on the loaded memory module 106. One way to reduce reflected noise is to increase dielectric loss in unloaded memory modules 108, 110 utilizing the lossy substrate of the invention.

It may also be useful to increase dielectric loss in the dielectric material between power and ground planes. It is known to form a substrate by placing a dielectric layer between a power plane and a ground plane. In such a system, radiated emissions such as Electromagnetic Interference (EMI) are often caused by high frequency waves propagating between the power and ground planes. Radiated emissions are a significant problem in high speed digital systems because they cause noise and device instability. A prior art approach to alleviate this problem is to connect a row of ground vias around the periphery of a printed circuit board. This solution creates a shield to block the radiation of energy from the edge of the printed circuit board. However, although high frequency energy at the edge of the printed circuit board may be reflected, this solution does not dissipate high frequency energy. Thus, it is desirable to develop a lossy dielectric for use between power and ground planes to dissipate high frequency energy and attenuate noise signals in high speed digital systems.

Figure 4:
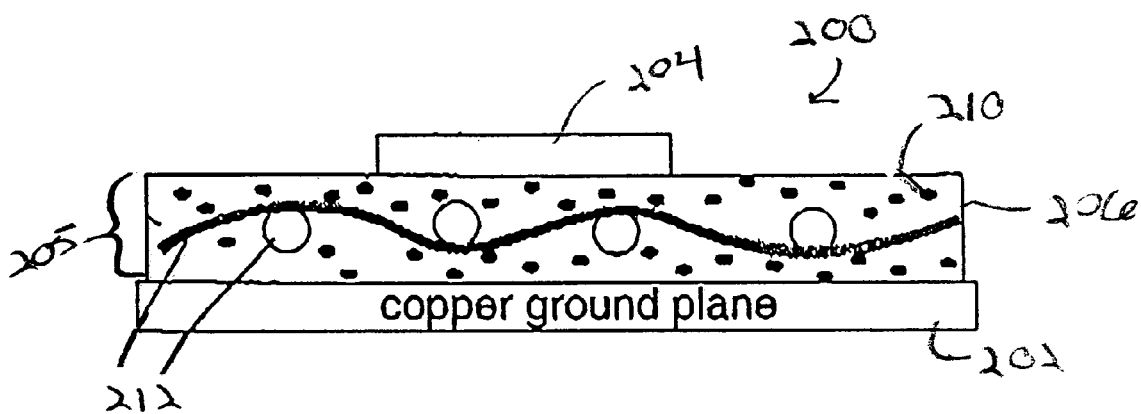
FIG. 4 illustrates a lossy substrate in the form of an epoxy with inserted resistive particles in accordance with an embodiment of the invention.

An electronic device that can be used to address the problems set forth above is shown in FIG. 4. FIG. 4 illustrates an electronic device 200 in accordance with an embodiment of the invention. The electronic device 200 includes a ground plane 202, a signal trace layer 204 and a lossy dielectric layer or substrate 205. By way of example, the lossy dielectric layer 205 is formed with a standard dielectric material 206 in the form of an epoxy. The standard dielectric material may include fibers of glass cloth 212.

In accordance with the invention, the lossy dielectric layer 205 includes inserted lossy materials 210 that operate to increase the dielectric loss of the standard dielectric material 206, thereby forming the lossy dielectric substrate 205 of the invention. In one embodiment of the invention, the substrate 205 is formed by mixing resistive particles at a predetermined ratio into a polymer resin system (e.g., epoxy or other thermoset plastics) prior to lamination and curing.

The inserted lossy materials may include resistive particles 210. As used herein, the term "resistive particles" refers to poorly conducting particles; that is, particles formed of a substance with a volume resistivity of at least $6 \times 10^{-8}$ ohms*m. By way of example, the resistive particles may be carbon. The added resistive particles 210 cause the layer of standard dielectric material 206 to become more lossy (i.e., have a higher dielectric loss). By controlling the insertion of resistive particles into the standard dielectric, the frequency response of the standard dielectric is altered for a desirable signal shaping. The alteration of a standard dielectric with resistive particles results in a low cost lossy substrate.

Figure 5:
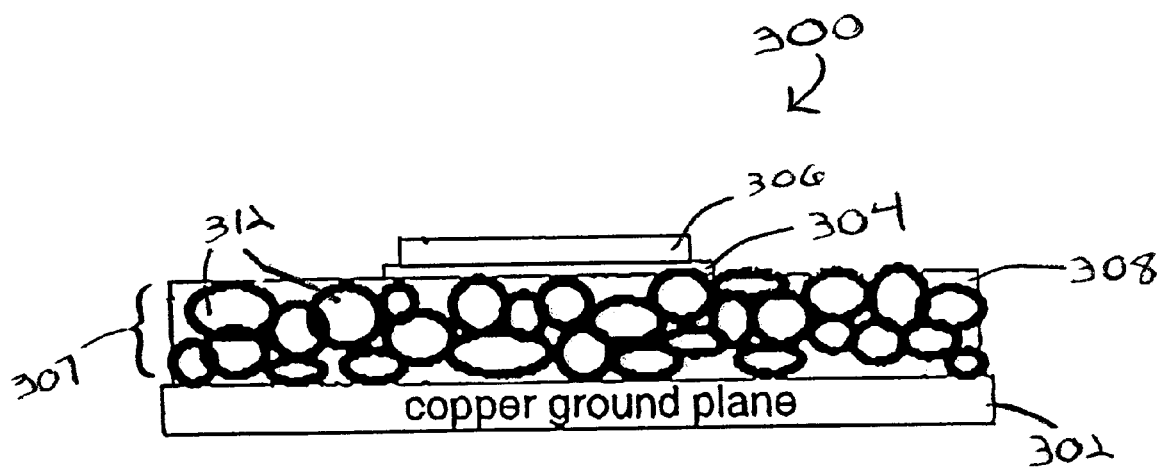
FIG. 5 illustrates a lossy substrate in the form of an epoxy with inserted open cell conductive foam in accordance with an embodiment of the invention.

FIG. 5 illustrates an electronic device 300 in accordance with another embodiment of the invention. The device 300 includes a ground plane 302, an insulating layer 304, a signal trace layer 306 and a lossy dielectric layer 307. The lossy dielectric layer 307 includes a standard dielectric 308, such as epoxy. An inserted lossy material 312 is positioned in the standard dielectric 308. The inserted lossy material may be an open cell conductive foam (i.e. carbon impregnated foam) 312. For example, a carbon loaded foam may be mixed into a polymer resin system (e.g., epoxy or other thermoset plastic) to form a composite lossy dielectric laminate. The conductive foam 312 causes the dielectric layer 308 to become more lossy (i.e., have a higher dielectric loss). The conductive foam is selectively inserted into the standard dielectric to achieve a predetermined frequency response, namely, the attenuation of high frequency signals.

Figure 6:
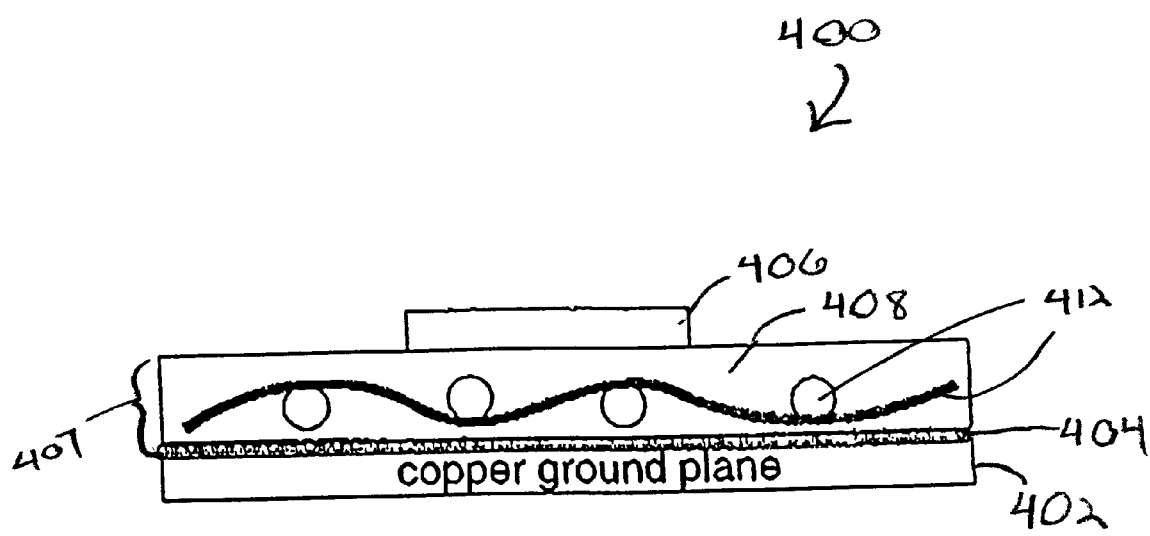
FIG. 6 illustrates a lossy substrate in the form of an epoxy with an attached layer of resistive material in accordance with an embodiment of the invention.

FIG. 6 illustrates an electronic device 400 in accordance with an alternate embodiment of the invention. In the apparatus of FIG. 6, the standard dielectric material is attached to a loss inducing physical structure, thereby forming a lossy dielectric. Specifically, the device 400 includes a ground plane 402 and a signal trace layer 406. Positioned between the ground plane 402 and the signal trace layer 406 is a lossy dielectric layer 407. The lossy dielectric layer 407 includes a standard dielectric material 408, such as epoxy. The standard dielectric material 408 includes standard fibers of glass cloth 412. The standard dielectric material 408 is modified with a loss inducing physical structure in the form of a planar resistive material layer 404. The planar resistive layer may be formed by adding high resistivity metals to copper or another conductive layer. The metal may be added by electroplating, immersion, or cladding processes. The resistive layer 404 is then attached to the standard dielectric material 408 using a conventional lamination process. This relatively simple manufacturing process stands in contrast to prior art techniques that add discrete components, such as resistors, to a standard dielectric material.

The resistive material layer 404 causes the standard dielectric material 408 to be more lossy. By way of example, the layer of resistive material 404 is made of a resistive material, such as solder, carbon, antimony, bismuth, or tungsten. As used herein, the term resistive material used in the layer of resistive material refers to a material with a resistivity of at least $6 \times 10^{-8}$ ohms*m.

Figure 7:
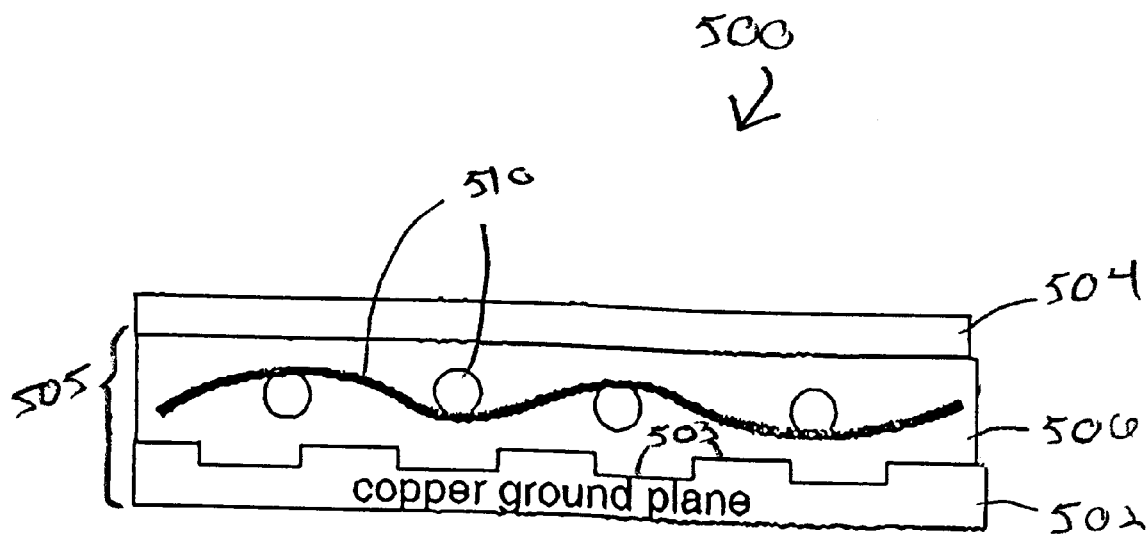
FIG. 7 illustrates a lossy substrate in the form of an epoxy with an attached patterned ground plane which attenuates high frequency signals in accordance with an embodiment of the invention.

FIG. 7 illustrates an electronic device 500 in accordance with an embodiment of this invention. The electronic device 500 includes a power plane 504 and a lossy dielectric 505. The lossy dielectric 505 may be implemented with a standard dielectric 506, such as epoxy. The standard dielectric 506 includes strands of glass cloth 510. As in the embodiment of FIG. 6, the lossy dielectric 505 is formed by attaching a loss inducing physical structure. The loss inducing physical structure is a ground plane 502 with an extended surface pattern. The extended surface operates to attenuate high frequency signals. In other words, the patterned surface 503 creates a lossy environment because high frequency signals are attenuated due to a long surface path.

FIG. 7 is a side view of a "waffle" pattern 503 that may be used in accordance with the invention. Other patterned surfaces may also be used. For example, the patterned surface may be formed by mechanical abrasion, chemical etch, and/or plasma etch. Conventional lamination processes are used to attach the patterned ground plane to the standard dielectric 506. Instead of using a low-loss standard dielectric such as borosilicate glass, a higher loss glass may be used to increase dissipation.

Those skilled in the art will appreciate that the lossy dielectric substrate of FIGS. 4–7 may be used to form modules 108–110 of FIG. 3. In addition, the disclosed substrate may be used between any ground and conducting planes in a high speed digital system in which it is desirable to dissipate high frequency energy and attenuate noise signals. Thus, in accordance with this embodiment, the signal traces in FIGS. 4–7 can be considered power planes.

The lossy substrate of the invention eliminates the need for discrete lossy components (e.g., resistors) to be added to a circuit. Therefore, system expense can be reduced. The lossy substrate provides distributed energy dissipation through loss inducing materials and/or a loss inducing physical structure.

Advantageously, the invention is formed of standard components and is therefore easy to fabricate. The components of the invention are low cost, thereby reducing the cost of the overall system.

Attention now turns to a different application for the lossy substrate of the invention. The technique of the invention can be used to modify a transmission line's characteristics for the purpose of reducing dispersion.

Figure 8:
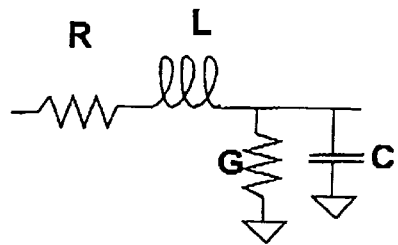
FIG. 8 illustrates a schematic for modeling a distributed transmission line.

The general model for a segment of a distributed transmission line is shown in FIG. 8. The phase constant, β, expressed in radians per unit length, can be found by the following approximation:

$$\beta = \left\{ \frac{1}{2} \cdot \left[ \sqrt{(R^2 + \omega^2 \cdot L^2) \cdot (G^2 + \omega^2 \cdot C^2)} - R \cdot C + \omega^2 \cdot L \cdot C \right] \right\}^{1/2}$$ (Approximation A)

an alternative approximation which typically gives similar results is:

$$\beta = \omega\sqrt{LC}\left[1 + \frac{1}{2}\left(\frac{R}{2\omega L} - \frac{G}{2\omega C}\right)^2\right]$$ (Approximation B)

The rate at which a wave moves along a transmission line is described as the velocity of propagation, $v_p$, and is found by:

$$v_p = \frac{\omega}{\beta}$$

As can be seen, in the general case, wave velocity is frequency dependent. Using Fourier analysis, a digital pulse can be considered to be composed of sinusoidal waves of multiple frequencies. If a transmission line can be constructed such that the velocity of propagation is not frequency dependent, the sinusoidal waves arrive at the end of the line with the same phase relationship which they had at the beginning. In this special case the line has no dispersion and the digital pulse arrives undistorted.

There are two special cases in which the velocity of propagation is independent of frequency. The first case is if the line has no loss, that is if R=0 and G=0, then the velocity of a wave moving along the transmission line is constant regardless of frequency and is found by the following equation:

$$v_p = \frac{\omega}{\beta} = \frac{\omega}{\omega\sqrt{LC}} = \frac{1}{\sqrt{LC}} \quad \text{if } R = 0 \text{ and } G = 0$$

In the second case, it was first noticed by Oliver Heaviside in the 1880's that if a line obeys the relationship R/L=G/C, then the velocity of propagation can be made independent of frequency. Such a line is sometimes called a "Heaviside distortionless line". One can see that this is true by examining "Approximation B" above.

$$v_p = \frac{\omega}{\beta} = \frac{\omega}{\omega\sqrt{LC}} = \frac{1}{\sqrt{LC}} \quad \text{if } \frac{R}{L} = \frac{G}{C}$$

Attention now turns to the role of the lossy substrate of the invention in controlling dispersion. It has been well understood for quite some time that one solution to reduce or eliminate dispersion is to adjust the transmission line parameters such that R/L=G/C. This fact is often disregarded due to the practical considerations involved with creating a suitable series resistance, R, and a parallel conductance, G. However, the fabrication approaches described herein yield cost-effective techniques to create a controlled R and G. Consider an example 50 ohm microstrip transmission line formed with standard PCB fabrication techniques. Reasonable values for the distributed line parameters for such a line are:

R = 4 ohms/m      G = 0
L = 350 nH/m     C = 140 pF/m

The dispersion of the above line can be eliminated if:

$$G = \frac{RC}{L} = \frac{4 \times 140 \times 10^{-12}}{350 \times 10^{-9}} = 1.6 \times 10^{-3} \text{ s/m}$$

Figure 9:
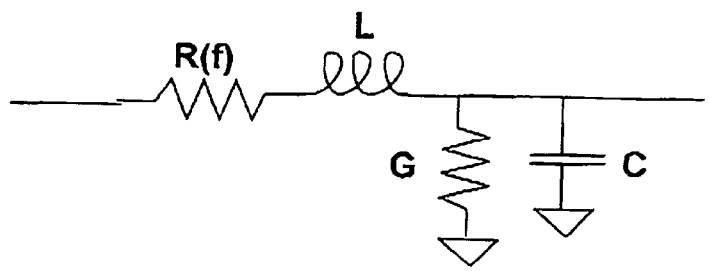
FIG. 9 illustrates for the schematic of FIG. 8 a frequency dependent resistance arising from resistive plating of a ground plane in accordance with an embodiment of the invention.

At high frequencies, adding resistance on the surface of the ground conductor is equivalent to increasing series R. FIG. 9 illustrates a frequency dependent resistive value in the case of resistive plating of a ground plane. In this case, at a high frequency, the resistance R is increased relative to a non-plated ground plane, all other factors being equal.

Figure 10:
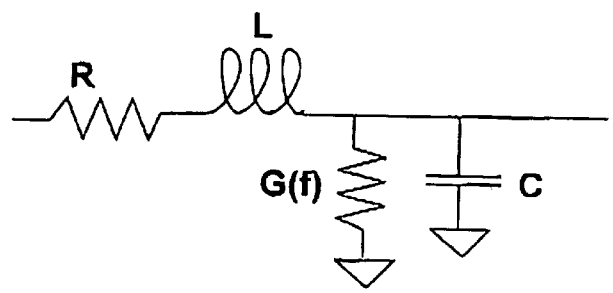
FIG. 10 illustrates for the schematic of FIG. 8 a frequency dependent conductance arising from particles inserted in a dielectric in accordance with an embodiment of the invention.

Making the dielectric material lossy, for example by adding carbon particles to the epoxy (e.g., FR4 epoxy), increases dielectric loss. Even though this doesn't create a DC conductance, it's still effective at reducing dispersion for high frequency components of the wave. FIG. 10 illustrates the conductance G being frequency dependent after the insertion of carbon particles in the dielectric. In other words, inserted carbon particles cause the value of G to increase relative to a standard dielectric, all other factors being equal.

Observe that the invention has been described in the context of resistance values. Naturally, the invention can also be described in the context of conductance values. Those skilled in the art will appreciate that the electronic devices shown in FIGS. 4–7 may be characterized as printed circuit boards.

The foregoing description, for purposes of explanation, used specific nomenclature to provide a thorough understanding of the invention. However, it will be apparent to one skilled in the art that the specific details are not required in order to practice the invention. In other instances, well known circuits and devices are shown in block diagram form in order to avoid unnecessary distraction from the underlying invention. Thus, the foregoing descriptions of specific embodiments of the present invention are presented for purposes of illustration and description. They are not intended to be exhaustive or to limit the invention to the precise forms disclosed, obviously many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated. It is intended that the scope of the invention be defined by the following claims and their equivalents.

What is claimed is:

1. An electronic device, comprising:
    a substrate having a first side and a second side;
    a conductive material on said first side of said substrate;
    a ground plane attached to said second side of said substrate; and
    wherein said substrate includes a lossy material integrated with a dielectric material to increase dielectric loss in said substrate;
    wherein said lossy material includes carbon impregnated open cell conductive foam.

2. The electronic device of claim 1 wherein the lossy material is a loss inducing physical structure forming the second side of the substrate, and the loss inducing physical structure has an uneven, extended surface to attenuate high frequency signals.

3. A module for using in an electronic system having a plurality of interconnected devices, the module comprising:
    a substrate having a first side and a second side;
    a signal trace on the first side of the substrate; and
    a ground plane attached to the second side of the substrate;
    wherein the substrate includes a lossy material integrated with a dielectric material to increase dielectric loss in the substrate, and the lossy material includes carbon impregnated open cell conductive foam.

4. The module of claim 3 wherein the lossy material is a loss inducing physical structure forming the second side of the substrate, and the loss inducing physical structure has an uneven, extended surface to attenuate high frequency signals.

5. The module of claim 3 wherein the module is an unloaded memory module containing no memory storage devices.

6. A system, comprising:
    a plurality of modules interconnected in series;
    at least one of the modules in the plurality of modules comprising:
        a substrate having a first side and a second side;
        a signal trace on the first side of the substrate; and
        a ground plane attached to the second side of the substrate;
        wherein the substrate includes a lossy material integrated with a dielectric material to increase dielectric loss in the substrate, and the lossy material includes carbon impregnated open cell conductive foam.

7. The system of claim 6 wherein the lossy material is a loss inducing physical structure forming the second side of the substrate, and the loss inducing physical structure has an uneven, extended surface to attenuate high frequency signals.

8. The system of claim 6 wherein the system comprises a memory system, the plurality of modules are memory modules, and the at least one module includes an unloaded memory module containing no memory storage devices.

9. A distributed transmission line for transmitting electronic signals, comprising:
    a dielectric material having a first side, a second side, and an associated parallel conductance G;
    a signal trace layer attached to said first side of the dielectric material and having an associated series resistance R and an associated inductance L; and
    a ground layer attached to the second side of the dielectric material, such that a distributed capacitance C is formed between said signal trace layer and said ground layer;
    wherein said dielectric material includes a lossy material integrated with said dielectric material to modify said parallel conductance G such that for a predetermined signal frequency range $$G \approx \frac{RC}{L}.$$

10. The distributed transmission line of claim 9 wherein the lossy material is a loss inducing physical structure forming the second side of the di electric material, and the loss inducing physical structure has an uneven, extended surface to attenuate high frequency signals.

11. The distributed transmission line of claim 10 wherein the lossy material includes carbon impregnated open cell conductive foam.

12. The distributed transmission line of claim 9 wherein the lossy material includes carbon impregnated open cell conductive foam.

* * * * *